(12) United States Patent
Harris et al.

(10) Patent No.: US 7,646,060 B2
(45) Date of Patent: Jan. 12, 2010

(54) METHOD AND DEVICE OF FIELD EFFECT TRANSISTOR INCLUDING A BASE SHORTED TO A SOURCE REGION

(75) Inventors: Christopher Harris, Täby (SE); Andrei Konstantinov, Järfälla (SE)

(73) Assignee: Cree Sweden AB, Kista (SE)

( * ) Notice: Subject to any disclaimer, the term of this patent is extended or adjusted under 35 U.S.C. 154(b) by 0 days.

(21) Appl. No.: 10/570,852

(22) PCT Filed: Sep. 5, 2003

(86) PCT No.: PCT/SE03/01382

§ 371 (c)(1),
(2), (4) Date: Mar. 6, 2006

(87) PCT Pub. No.: WO2005/024923

PCT Pub. Date: Mar. 17, 2005

(65) Prior Publication Data

US 2006/0252212 A1 Nov. 9, 2006

(51) Int. Cl.
*H01L 29/94* (2006.01)
(52) U.S. Cl. .................. 257/341; 257/343; 257/346; 257/333; 257/E29.187

(58) Field of Classification Search .................. 257/341, 257/343, 346, E29.187, 333
See application file for complete search history.

(56) References Cited

U.S. PATENT DOCUMENTS

| | | | | |
|---|---|---|---|---|
| 4,599,790 A | * | 7/1986 | Kim et al. | 438/182 |
| 4,728,621 A | * | 3/1988 | Graf et al. | 438/183 |
| 6,127,695 A | * | 10/2000 | Harris et al. | 257/77 |
| 6,358,827 B1 | | 3/2002 | Chen et al. | |
| 6,387,735 B1 | | 5/2002 | Ueda | |
| 6,515,320 B1 | * | 2/2003 | Azuma et al. | 438/183 |

FOREIGN PATENT DOCUMENTS

WO 03/028109 4/2003

* cited by examiner

*Primary Examiner*—Walter L Lindsay, Jr.
*Assistant Examiner*—Ron E Pompey
(74) *Attorney, Agent, or Firm*—Dilworth & Barrese LLP

(57) ABSTRACT

Method for producing a field effect transistor having a source region (9), a drain region and a channel layer (11) interconnecting the source and drain regions, and including the step of providing a sacrificial layer (4) on part of a semiconductor material (1) whose edge is used to define the edge of an implant, such as the source region (9), in the semiconductor material (1), where the edge (4c) of the sacrificial layer (4) is subsequently used to define the edge of a gate (16).

25 Claims, 4 Drawing Sheets

METHOD AND DEVICE OF FIELD EFFECT TRANSISTOR INCLUDING A BASE SHORTED TO A SOURCE REGION

TECHNICAL FIELD OF THE INVENTION AND PRIOR ART

The present invention relates to a method for producing a field-effect transistor such as a JFET, MESFET or MOSFET. The field effect transistor produced using the method of the present invention is intended particularly, but not exclusively for switching high frequency signals (above 1 MHz and preferably above 1 GHz) in microwave applications such as in base stations for mobile phones, radars, microwave ovens and in generating plasmas.

In a field effect transistor the gate is used to control the current flowing in an underlying channel layer formed between the source region and drain region. During operation of the transistor a voltage is supplied to the gate in order to create an electric field between the gate and the source and drain regions, which affects the conductivity of the channel.

Upon applying a potential of a certain magnitude to the gate a depletion region will form in the channel layer extending into the region below the channel layer which means that current flow through the channel layer will be blocked and the transistor will be in the off-state. When such a voltage is not applied a depletion region will not be formed, the channel layer will be continuous and current will flow between the source and drain contacts and the transistor will be in the on-state. For an applied voltage between these two extremes the current flow through the device is accordingly a function of the applied voltage itself.

The gate of an FET acts as a capacitor for which the amount of charge in the capacitor regulates the flow of current through the device. A high frequency device minimises the size of this capacitance so as to minimise the time necessary to charge or discharge, thereby optimising the switching speed. The amount of capacitance depends on the gate length i.e. the lateral extension of the gate between the source region and the drain region of the transistor. High frequency field-effect transistors require short gates in order to increase on-state channel current as well as to minimise the carrier transit time in the channel and the gate capacitance. Shorter gates therefore result in higher power and higher operation frequency.

However, undesirable short-channel effects become significant as the gate length is decreased. Transistors with very short gates often do not show saturation in drain current with increasing drain bias, and a continual increase in drain current with increasing drain bias is observed instead. This occurs because of the modulation of the channel under the gate by the drain bias. Furthermore, in the extreme case a parasitic bipolar transistor can be turned on at a high drain bias, in which the source and drain act as the collector and emitter of the parasitic transistor, and the layer next to the channel layer, which is a substrate or buffer layer, is then the base. This effect may not be particularly significant for low power high frequency transistors, but it increasingly dominates the performance of high power transistors, in which the drain bias should be as high as possible in order to increase the total power.

The performance of a high frequency transistor is critically dependent on the alignment of the gate relative to the source/drain electrode. Traditionally transistor features such as gates are defined and delineated using lithographic techniques such as photolithography, x-ray, or electron-beam lithography. Lithography is the process of transferring an image from a mask, layer by layer, to the surface of a semiconductor material for example via an ion implant, oxidation or metallization process between each successive image transfer.

Lithography techniques require a plurality of process steps each usually involving a resist mask. Overlay alignment of subsequent resist masks using special alignment features on the semiconductor material requires exact positioning of the mechanism supporting the semiconductor material. The overlay accuracy should preferably be considerably higher than the smallest feature size. However, mechanical alignment of the various resist masks necessary for the production of a field-effect transistor having a gate length of 0.5 µm or less is very difficult to achieve due to the mechanical nature of the overlay alignment process.

In order to avoid misalignment of the gate with respect to the source and drain regions self-alignment techniques are often used. The conventional method of manufacturing the source/drain region of a transistor in a semiconductor material includes using the gate (formed by a lithographic process) as a mask to carry out lightly doped ion implants, thereby forming a lightly doped source/drain region. Thereafter, spacers are formed on the sidewalls of the gate and then a heavily doped ion implant is carried out using the gate and spacers as a mask. Finally the semiconductor material is annealed to form heavily doped source/drain regions. The source region and the drain region are self-aligned with respect to the gate i.e. the gate is substantially centrally positioned within the active region without the need of a separate aligning step. The spacers are used to prevent a portion of the dopants from diffusing into the bottom section of the gate during the annealing operation so that parasitic capacitors are not created between the source/drain terminals.

A disadvantage of this method is that there is a limitation on the minimal gate length that can be obtained which corresponds to the resolution of the lithography technique used to produce the gate. Furthermore the high temperatures required for annealing can be harmful to the gate. Another disadvantage is that the conducting channel that interconnects the source and drain regions is formed before the source and drain regions are implanted and annealed. Ion implantation is therefore carried out through the channel layer. The damage caused to the semiconductor crystal structure in the channel layer by atomic collisions during ion implantation of the source and drain regions may not be completely annealed out in a subsequent heat treatment. Such crystal structure damage affects the mobility of charge carriers along the channel and consequently adversely affects the performance of the transistor.

In recent years there has been an increasing interest in the use of silicon carbide (SiC) in high power and high frequency transistors. SiC transistors are suitable for service in high temperature and corrosive environments under which silicon and conventional group III-V semiconductors cannot function adequately. SiC is very useful as a semiconductor because of it's wide band gap, high thermal conductivity, high saturated electron drift velocity, low dielectric constant and high electric breakdown field. Furthermore, SiC is thermally, chemically and mechanically stable.

U.S. Pat. No. 6,127,695 discloses a lateral SiC field effect transistor for switching high frequencies comprising a source region layer and a drain region layer laterally spaced and of highly doped n-type. An n-type channel layer of lower doping concentration extends laterally and interconnects the source region layer and the drain region layer for conducting a current between these layers in the on-state of the transistor. A highly doped p-type base layer is arranged next to the channel layer at least partially overlapping the gate and being at a lateral distance to the drain region layer, said base layer being shorted to the source region layer.

The highly doped p-type base layer increases the possible operation speed of the field-effect transistor and allows it to be operated at a higher power by blocking the extension of the depleting region from the source region layer to the drain region layer. The electric field is therefore entirely blocked by the highly doped base layer, so that a parasitic bipolar transistor can not be formed, even if the lateral length of the gate is very small. Furthermore, the p-n-junction so created can block higher voltages than a Schottky barrier, resulting in an increase of the possible power. The lateral extension of the highly doped base layer is confined so that it will not extend underneath the drain region to keep the drain-to-gate capacitance low.

The gate of the transistor described in U.S. Pat. No. 6,127, 695 not only has to be aligned with respect to the source/drain electrode but additionally to the highly doped p-type base layer. If the gate is formed too close to the drain electrode the high voltage capability of the transistor will be lost. If the gate is formed too far from the source electrode the high frequency capability of the transistor will be lost.

In order to facilitate the alignment of the gate with respect to the highly doped p-type base layer the highly doped p-type base layer could be made larger. This would however lead to a large depletion of the n-type channel layer and consequently result in a lower power output of the transistor.

SUMMARY OF THE INVENTION

The object of the present invention is to provide a method for positioning the gate in a field-effect transistor, which has a better resolution than current lithography and spacer technology.

This object is fulfilled using the method for producing a field effect transistor comprising a source region, a drain region and a channel layer interconnecting the source and drain region. The method comprises the steps of providing a sacrificial layer on the part of a semiconductor material whose edge is used to define the edge of an implant, such as the source region, in the semiconductor material where the edge of the sacrificial layer is subsequently used to define the edge of a gate.

According to a preferred embodiment of the invention, the method further comprises the step of growing a second sacrificial layer of thickness t over the semiconductor material and the first sacrificial layer so as to define a second point on the semiconductor material at a lateral distance t from the edge of the first sacrificial layer. This method may be used to align a subsequently-formed overlying gate with respect to two transistor features. This method allows very accurate alignment of the gate because it relies on the growth of a sacrificial layer, which can be very well controlled to a resolution of tens of nanometres.

According to another preferred embodiment of the invention the method further comprises the step of anisotropically etching away the second sacrificial layer except for the section adjacent to the edge of the first sacrificial layer so as to more accurately define a second point on the semiconductor material at a lateral distance t from the edge of the first sacrificial layer and so as to allow an implant to be made.

According to a preferred embodiment of the invention the source and drain regions are formed prior to the formation of the channel layer and the gate is formed after the formation of the channel layer.

According to a further preferred embodiment of the invention the width of the gate is determined by the accurately controlled growth of non-sacrificial layers such as semiconductor or dielectric layers on the channel layer.

According to a preferred embodiment of the invention the sacrificial layer or layers comprise an oxide, such as $SiO_2$, a nitride such as $Si_3N_4$, polysilicon or any other material that can withstand the temperatures to which the semiconductor material is subsequently subjected in process steps such as ion implantation. The sacrificial layer or layers are either grown or deposited on the semiconductor material.

According to another preferred embodiment of the invention the semiconductor material comprises Silicon, Silicon Carbide, Gallium Arsenide or any other III-V semiconductor.

According to a yet further preferred embodiment of the invention the edge of the first sacrificial layer defines the edge of a highly doped p-type base layer doped with Aluminium, Beryllium, Boron or some other dopant depending on the semiconductor material. Aluminium is the preferred dopant type in SiC, because Aluminium acceptors have a lower thermal activation energy than Boron, for instance, and therefore a higher conductivity can be obtained for Aluminium-doped layers. The highly doped p-type base layer is preferably doped to a concentration of greater than $10^{18}$ cm$^{-3}$ when Silicon Carbide is used as the semiconductor material.

According to a further preferred embodiment of the invention the highly doped p-type base layer is formed so as to totally overlap the gate.

The invention also concerns a field effect transistor comprising a source region and a drain region laterally spaced and of highly doped n-type and an n-type channel layer of lower doping concentration extending laterally and interconnecting the source region and the drain region for conducting a current between these layers in the on-state of the transistor. The transistor comprises a gate formed upon the n-type channel layer, which is self-aligned with respect to at least one underlying implant, such as the source region, as a result of a method according to the present invention.

According to a preferred embodiment of the invention the field effect transistor comprises a highly doped p-type base layer arranged next to and under the channel layer at least partially overlapping the gate that is arranged above the channel layer, said base layer being shorted to the source region.

The present invention also relates to a field effect transistor produced using a method according to the invention, which is suitable for switching high frequencies above 1 MHz, preferably above 1 GHz with a power above 1 W. Such a transistor may be used in base stations for mobile telephones, radars, microwave heating applications, or for generating gas plasmas.

Further advantages as well as advantageous features of the invention appear from the following description.

BRIEF DESCRIPTION OF THE DRAWINGS

In the figures like numbering represents like elements.

The following description and drawings are not intended to limit the present invention to the embodiment disclosed. The embodiment disclosed merely exemplifies the principles of the present invention.

DESCRIPTION OF THE PREFERRED EMBODIMENTS

The following example relates to a SiC MESFET however the method of the present invention is suitable for the production of any field effect transistor comprising any semiconductor material. Since the mobility of free electrons in SiC is considerably higher than the mobility of valence-band holes, all microwave SiC transistors are of the n-p-n type. The method for producing an n-p-n transistor is therefore given by way of example.

Figure 1:
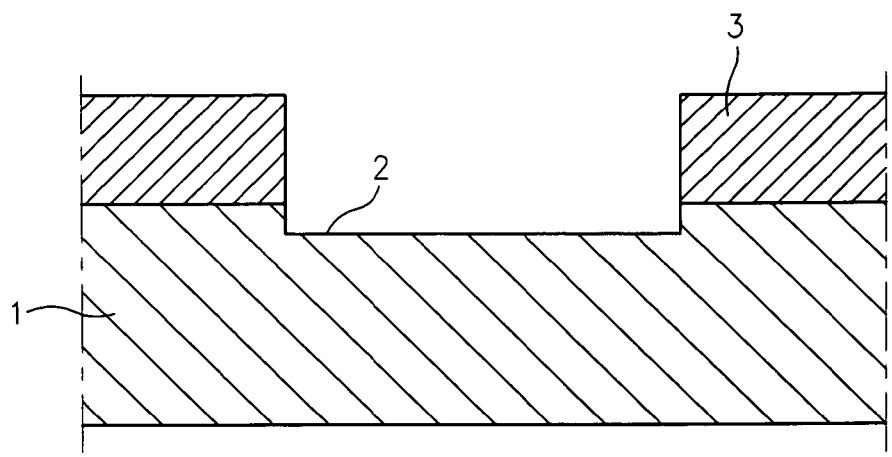
FIGS. 1-10 are schematic cross-sectional views of a semiconductor material at various stages during the production of a silicon carbide metal-semiconductor field-effect transistor (MESFET) comprising a self-aligned gate according to a preferred embodiment of the invention.

FIG. 1 shows a p-type SiC layer 1 having a doping concentration of greater than $1\times10^{16}$ cm$^{-3}$ in which a trench 2 has been etched. The p-type SiC layer can be epitaxially grown on top of a semi-insulating semiconductor material using Chemical Vapour Deposition for example.

Figure 2:
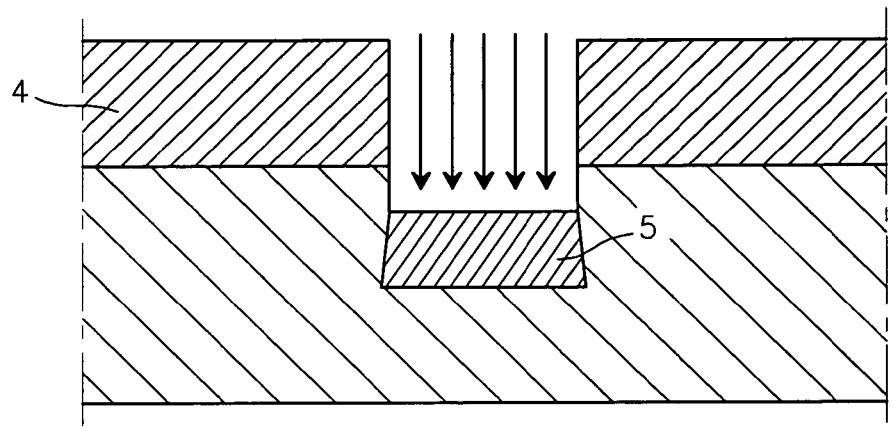

FIG. 2 shows a first sacrificial oxide layer 4 that has been provided upon the p-type layer 1, using a lithography process in which the pattern from a resist layer is transferred to an oxide for example. An aperture is patterned in the oxide layer 4 and Aluminium ions are implanted through the aperture to form a highly doped p-type base layer 5 of box-type profile having a depth of 0.3 µm and an active concentration of greater than $1\times10^{17}$ cm$^{-3}$. The implanted ions are then activated by annealing. The highly doped p-type base layer 5 may also be formed by diffusion if silicon is used as the semiconductor material.

Figure 3:
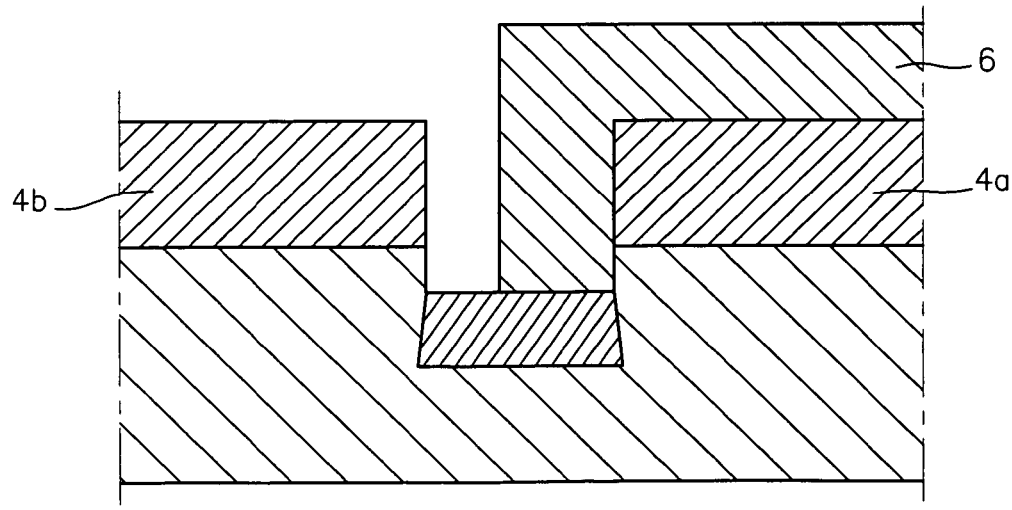

FIG. 3 shows a layer of resist 6 that has been applied to protect part of the oxide layer 4a. The rest of the oxide 4b is then etched away.

Figure 4:
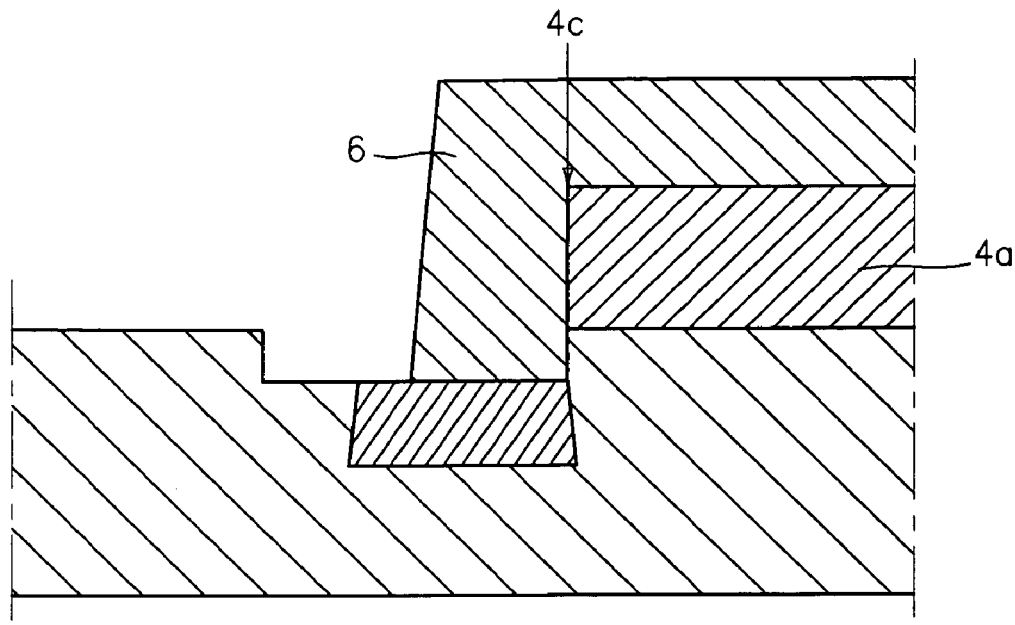

FIG. 4 shows the situation after the oxide 4b on one side of the trench has been etched away. The edge of the remaining oxide layer 4c defines the edge of the highly doped p-type base layer 5.

Figure 5:
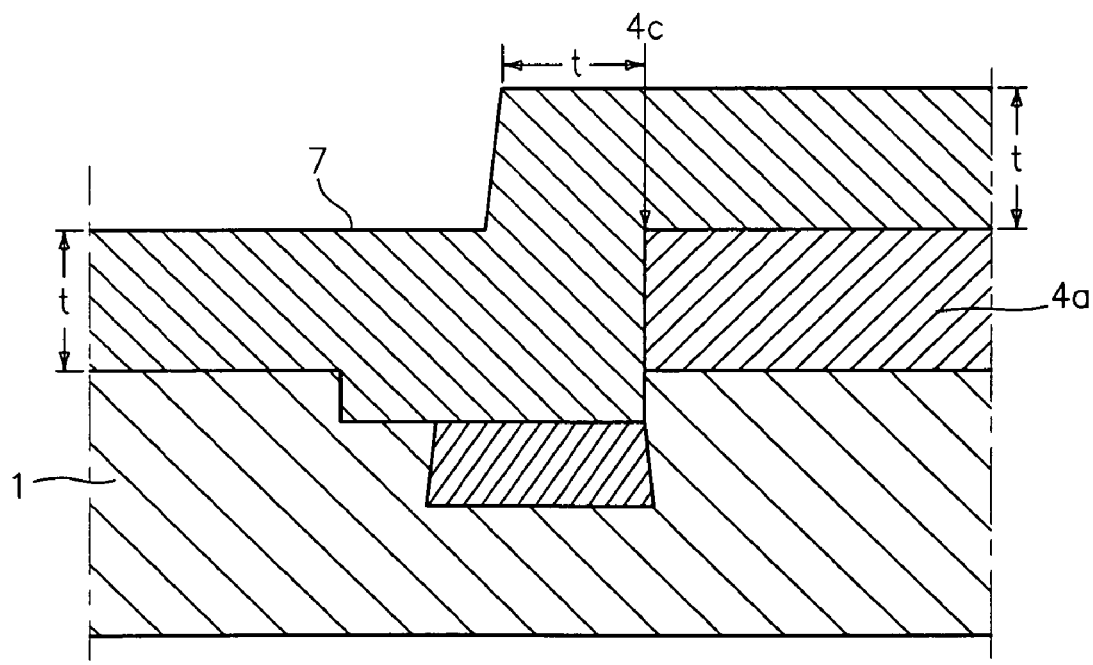

In the next step, shown in FIG. 5, the resist 6 is removed and a second sacrificial oxide layer 7 of thickness t is deposited over the p-type layer 1 and the previously grown/deposited oxide layer 4a allowing good control of the thickness and properties of the second sacrificial oxide layer. A vertical (anisotropic) etch is then carried out to etch away the uppermost parts of the second sacrificial oxide layer 7.

Figure 6:
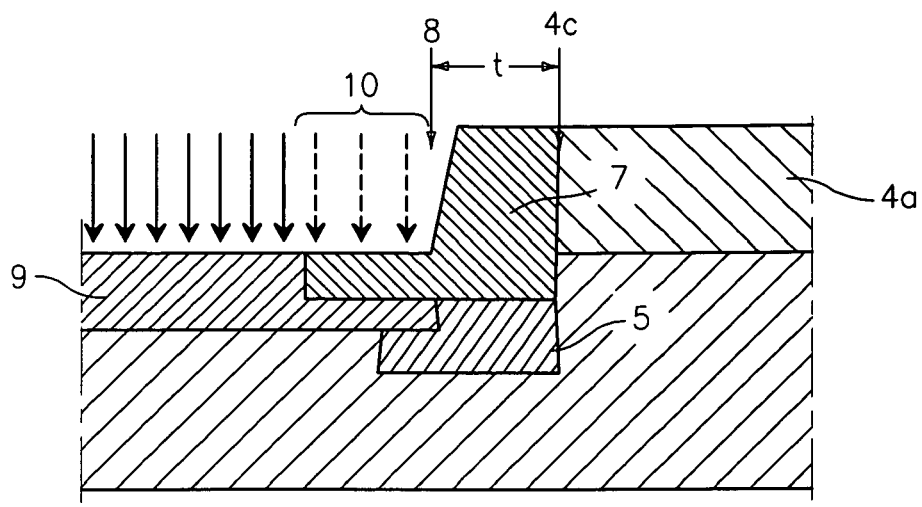

FIG. 6 shows what remains of the second sacrificial oxide layer 7 after anisotropic etching. A position 8 at a distance t from the perpendicular wall 4c of the oxide layer 4a is defined. Position 8 defines where the edge of a subsequently formed n-doped source region 9 will be formed. The source region 9 is formed by ion implantation of Nitrogen or Phosphorus ions for example to a concentration of greater than $1\times10^{18}$ cm$^{-3}$. The remaining oxide 7 acts as a mask for this ion implantation, some n-type dopants being implanted by pushing through the oxide over area 10. The source region is then annealed to make the dopants implanted electrically active.

The source region 9 is arranged in direct contact with the highly doped p-type base layer 5. The pn-junction formed between source region layer 9 and the highly doped p-type base layer 5 has a high capacitance, which provides an efficient sink of the high frequency signal to the source.

A drain region (not shown) can be formed in a similar way so that the length and location of the MESFET's active region between the source region and the drain region are determined by well-controllable oxide growth, etching and ion implantation processes without the necessity of any mechanical aligning steps. Apart from allowing accurate control of the positioning of transistor features a further advantage of this method is that the source and drain regions are implanted and annealed prior to the formation of the channel layer so that ion implantation does not have to be carried out through the channel layer. The implantation of the source and drain regions can not therefore damage the semiconductor crystal structure in the channel layer and cannot therefore adversely effect the mobility of electrons in the channel layer. Once the source and drain regions have been implanted and annealed a channel layer can be formed.

Figure 7:
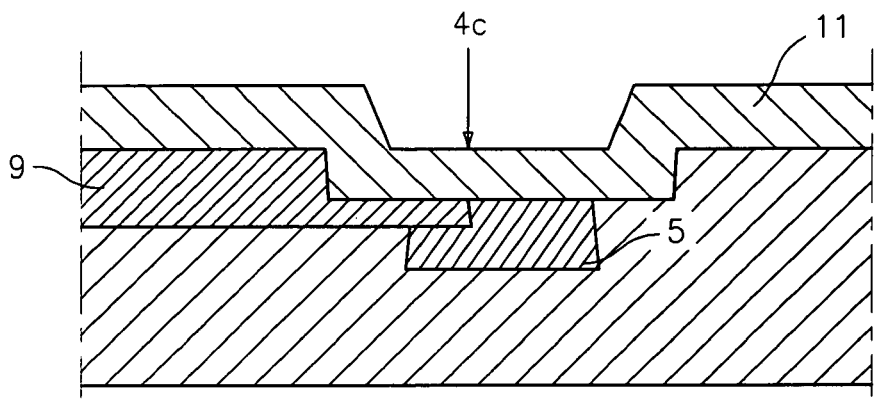

FIG. 7 shows that the oxide layers 4a and 7 have been etched away and an n-type channel layer 11 having a doping concentration greater than $1\times10^{17}$ cm$^{-3}$ has been epitaxially grown on top of the p-type layer 1 and the highly doped p-type base layer 5 to electrically interconnect the source region 9 and drain region (not shown).

Figure 8:
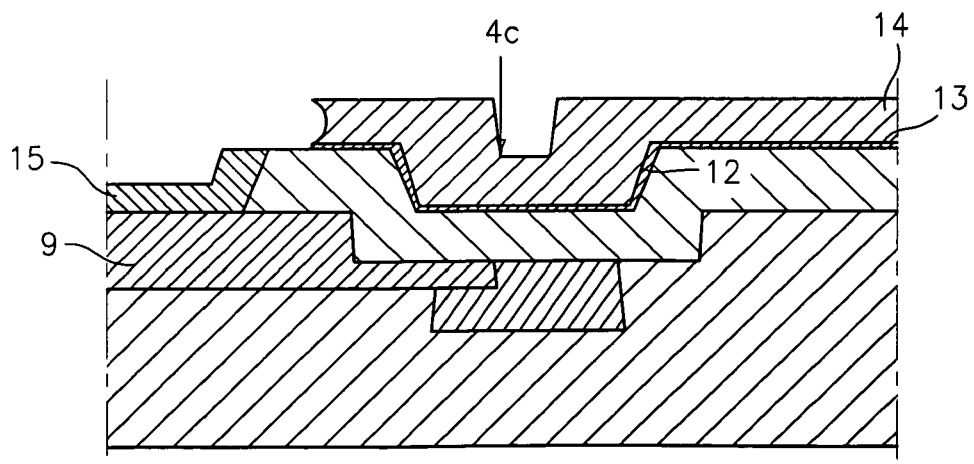

FIG. 8 shows the subsequent deposit of a thermal oxide 12, dielectric layers 13, 14, such as silicon nitrides (SiN$_x$) and a metal 15 to provide a source contact. The thickness of the deposited layers 12, 13, 14 determines the width of the gate.

Figure 9:
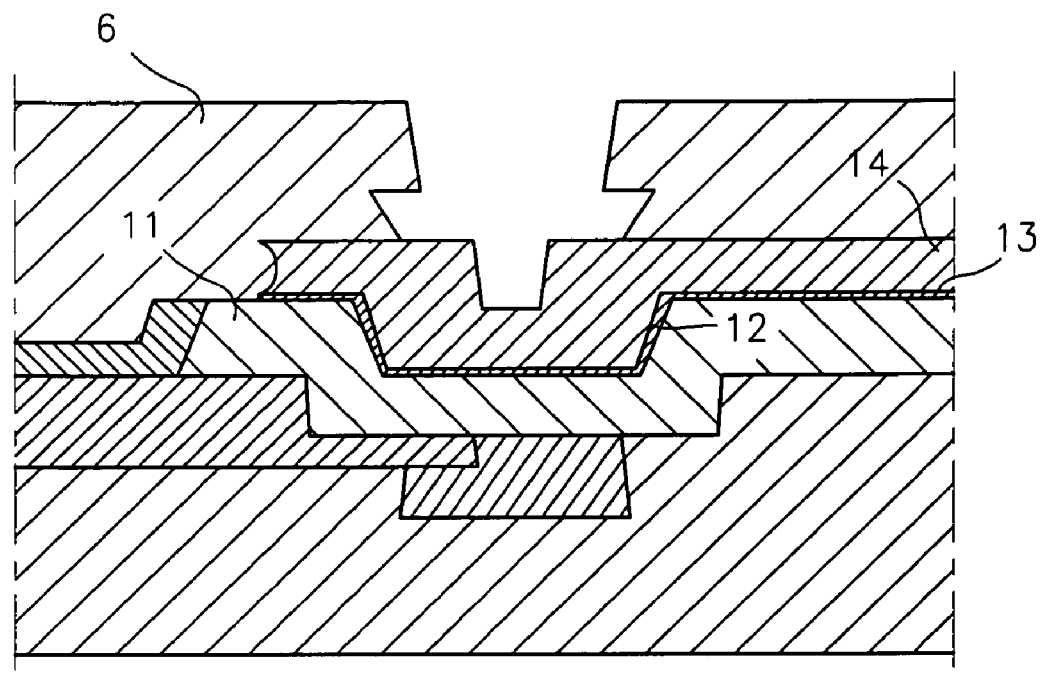
Figure 10:
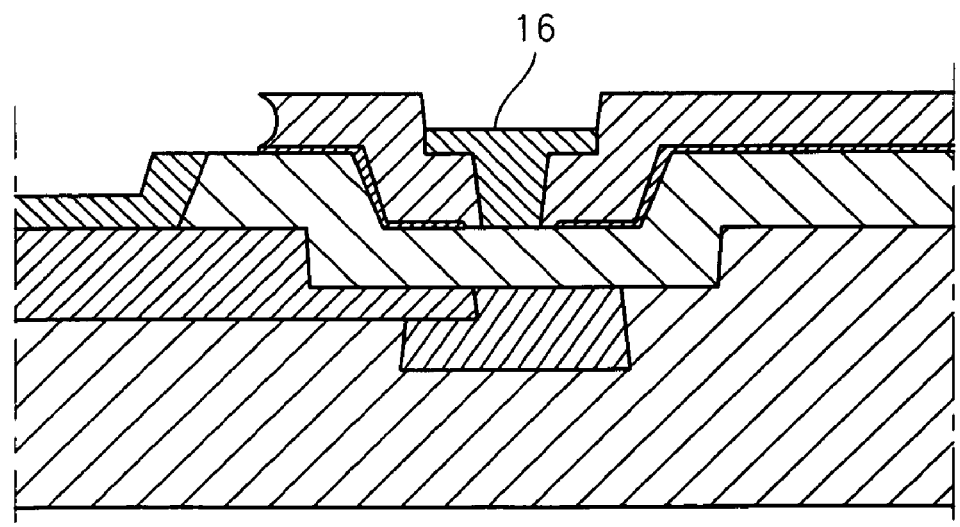

FIG. 9 shows the step of applying resist 6 and dry etching vertically through the dielectric layers 14, 13 and the thermal oxide layer 12 until the n-type channel 11 is exposed. In MISFETS an insulation layer may be arranged between the gate and the channel layer so as to provide better high temperature capabilities.

Finally metal is deposited in the resulting gate opening to produce a gate 16. There is no planar overlap between the gate 16 and the source region and the highly doped p-type base layer 5 totally overlaps the gate. The elimination or reduction of the overlap between the gate and source regions is important as it reduces the gate-source capacitance, which can adversely affect the on-state performance of a high frequency transistor.

Self-alignment of the gate 16 is guaranteed as a result of the process sequence prior to gate definition. Errors arising from the mask misalignment that are unavoidable in lithographic processes are eliminated so the product yield is improved. In addition much shorter gate lengths, less than 1.5 µm, preferably less than 0.4 µm are obtainable thus improving transistor performance.

The method according to the present invention describes only the most important steps for producing a field effect transistor. The method can be used to produce any device containing one or more field effect transistors. For example said at least one field effect transistor can be produced on a substrate comprising Silicon, Silicon Carbide, Gallium Arsenide or any other group III-V semiconductor. The device can further comprise final passivation, such as an oxide-nitride-oxide passivation layer for SiC MESFETs.

The invention is of course not in any way restricted to the preferred embodiments thereof described above, but many possibilities to modifications thereof would be apparent to a man with ordinary skill in the art without departing from the basic idea of the invention as defined in the appended claims.

The invention claimed is:

1. Field effect transistor comprising
   a source region (9),
   a drain region laterally spaced from said source region (9) and of highly doped n-type,
   a base layer (5) of highly doped p-type,
   an n-type channel layer (11) of lower doping concentration extending laterally and overlying both said source region (9) and base layer (5) and interconnecting the source region (9) and the drain region for conducting a current between these layers in the on-state of the transistor,
   said source region (9) having a portion overlapping said base layer (5), interposed between said base layer (5) and channel layer (11) and defining a vertical edge along said base layer (5), and
   a gate (16) formed upon the n-type channel layer (11) which is self-aligned both laterally and perpendicularly with respect to the underlying source region (9) and base layer (5), with said gate (16) not overlapping said source region (9) and entirely overlapping said base layer (5), and additionally comprising a dielectric layer (14) situated upon said channel layer (11) and above both said source (9) and drain regions and comprising an opening for receiving metal forming the gate (16) self-aligned both laterally and perpendicularly.

2. Method for producing a field effect transistor according to claim 1 and comprising a source region (9), a drain region and a channel layer (11) interconnecting the source and drain region, which includes the step of providing a sacrificial layer (4) on part of a semiconductor material (1) whose edge is used to define the edge of an implant, such as the source region (9), in the semiconductor material (1), wherein the edge (4c) of the sacrificial layer (4) is subsequently used to define the edge of the gate (16).

3. Method according to claim 2, further comprising the step of growing a second sacrificial layer (7) of thickness (t) over the semiconductor material (1) and the first sacrificial layer (4) to define a second point (8) on the semiconductor material at a lateral distance (t) from the edge (4c) of the first sacrificial layer (4).

4. Method according to claim 3, further comprising the step of anisotropically etching away the second sacrificial layer (7) except for the section adjacent to the edge (4c) of the first sacrificial layer (4).

5. Method according to claim 2, wherein the source (9) and the drain regions are formed prior to the formation of the channel layer (11) and the gate is formed after the formation of the channel layer (11).

6. Method according to claim 5, wherein the width of the gate is determined by the accurately controlled growth of non-sacrificial layers such as semiconductor of dielectric layers upon the channel layer (11).

7. Method according to claim 2, wherein the first sacrificial layer (4) comprises an oxide; such as silicone oxide, a nitride; such as a silicon nitride, or polysilicon.

8. Method according to claim 3, wherein the second sacrificial layer (7) comprises an oxide, such as silicon oxide, a nitride, such as silicon nitride, or polysilicon.

9. Method according to claim 2, wherein the semiconductor material (1) comprises Silicon, Silicon Carbide, Gallium Arsenide or any other group III-V semiconductor.

10. Method according to claim 2, wherein the edge of the first sacrificial layer (4c) defines the edge of a highly doped p-type base layer (5).

11. Method according to claim 10, wherein Aluminium, Beryllium or Boron is used as the dopant for the highly doped p-type base layer (5) when silicon carbide is used as the semiconductor material.

12. Method according to claim 11, wherein the highly doped p-type base layer (5) is doped to a concentration of greater than $10^{18}$ cm$^{-3}$ when silicon carbide is used as the semiconductor material (1).

13. Method according to claim 8, wherein a highly doped p-type base layer (5) is formed to totally overlap the gate (16).

14. Field effect transistor according to claim 1, further comprising a highly doped p-type base layer arranged next to and under the channel layer at least partially overlapping the gate (16) arranged above the channel layer (11), said base layer being shorted to the source region.

15. Device comprising at least one field effect transistor according to claim 1.

16. Use of a transistor according to claim 1 for switching high frequencies above 1 MHz, preferably above 1 GHz.

17. Use of a transistor according to claim 1 for switching high frequency signals with a power above 1 W.

18. Use of a transistor according to claim 1 in base stations for mobile telephones, radars, microwave heating applications, or for generating gas plasmas.

19. Method according to claim 2, wherein the source (9) and the drain regions are formed prior to the formation of the channel layer (11) and the gate is formed after the formation of the channel layer (11).

20. Method according to claim 4, wherein the source (9) and the drain regions are formed prior to the formation of the channel layer (11) and the gate is formed after the formation of the channel layer (11).

21. Transistor according to claim 1, having just a single dielectric layer (14) situated upon said channel layer (11).

22. Transistor according to claim 1, additionally comprising a thermal oxide layer (12) situated between said dielectric (14) and channel (11) layers and on either side of said gate (16).

23. Transistor according to claim 1, wherein a vertical edge of said gate (16) and a vertical edge between said source region (9) and base layer (5) are situated in substantially the same vertical plane.

24. Transistor according to claim 23, wherein said gate (16) is situated directly upon said channel layer (11).

25. Transistor according to claim 1, wherein said gate (16) is situated directly upon said channel layer (11).

* * * * *